United States Patent
Kuliyampattil et al.

(10) Patent No.: US 7,372,713 B2
(45) Date of Patent: May 13, 2008

(54) MATCH SENSING CIRCUIT FOR A CONTENT ADDRESSABLE MEMORY DEVICE

(75) Inventors: Nisha Padattil Kuliyampattil, Karnataka (IN); Krishnan S Rengarajan, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 143 days.

(21) Appl. No.: 11/279,903

(22) Filed: Apr. 17, 2006

(65) Prior Publication Data

US 2007/0242493 A1    Oct. 18, 2007

(51) Int. Cl.
*G11C 15/00* (2006.01)
(52) U.S. Cl. .................... 365/49; 365/185.2; 711/101; 711/108
(58) Field of Classification Search .................. 365/49, 365/185.2; 711/101, 108
See application file for complete search history.

(56) References Cited

U.S. PATENT DOCUMENTS

| | | | |
|---|---|---|---|
| 6,307,798 B1 * | 10/2001 | Ahmed et al. .............. 365/207 |
| 6,442,054 B1 * | 8/2002 | Evans et al. ................... 365/49 |
| 6,744,653 B1 * | 6/2004 | Huang .......................... 365/49 |
| 2003/0123269 A1 * | 7/2003 | Gillingham et al. .......... 365/49 |
| 2003/0161194 A1 * | 8/2003 | Ma et al. ..................... 365/200 |

\* cited by examiner

*Primary Examiner*—Anh Phung
*Assistant Examiner*—Eric Wendler
(74) *Attorney, Agent, or Firm*—Alan K. Stewart; W. James Brady; Frederick J. Telecky, Jr.

(57) ABSTRACT

A Content Addressable Memory (CAM) device with an improved match sensing circuit is provided. The CAM is provided with a dummy cell and a respective dummy match line, as well as a reference dummy match line. The dummy match line is designed to be evaluated after all other cell match lines. The reference dummy match line triggers a dummy sensing block to initiate a time window for sensing the dummy match line. By this time, all other array match lines will have been stabilized and have reached their respective sensing blocks, to then allow the data to be latched. The match sensing circuit provided may be applied to a variety of arrangements including BCAMs and TCAMs.

17 Claims, 3 Drawing Sheets

MATCH SENSING CIRCUIT FOR A CONTENT ADDRESSABLE MEMORY DEVICE

FIELD OF THE INVENTION

The present invention relates to Content Addressable Memory devices, and in particular, to sensing circuitry therefor.

BACKGROUND OF THE INVENTION

Content Addressable Memory (CAM) devices are searchable memory devices that are used in applications that require high-speed searching. Such applications include packet forwarding and packet classification in Internet routers, data compression applications and neural networks.

CAMs are composed of conventional semiconductor memory (usually SRAM) with added comparison circuitry that enables a search operation to be completed in a single clock cycle.

A CAM device consists of an array of memory cells, each capable of storing one bit of information. The cells are each connected to respective feed lines which apply an input bit to compare with the bit stored in the cell, using the cell-dedicated comparison circuitry. If the input bit matches the stored bit, a match signal will be generated to the device output, providing the location of the match cell.

There are two types of CAM devices. The first is known as a Binary CAM device, in which the memory cells store one of a binary bit i.e. a 1 or a 0. The second type is known as a Ternary CAM or TCAM, in which the memory cells can store a 1, a 0 or a "don't care" (X) value, which will indicate a match with either a 1 or a 0 input to the device.

FIG. 1 shows an exemplary layout of a conventional TCAM 4 by 4 bit device 10. Device 10 has 16 memory cells 11, arranged in an array of four columns and four rows. An example of a TCAM cell is described in U.S. Pat. No. 5,313,590, the contents of which are hereby incorporated by reference.

Each cell 11 is electrically connected to a pair of feed lines or search lines 12a, 12a' to 12d, 12d'. At an input to the device 10, search data (in this case a 4-bit word) is input to search line driver 14. Each pair of search lines 12a, 12a' to 12d, 12d' carries one bit of the four-bit word, to provide this bit to cells 11 in that column.

Each cell is also connected to one of match lines 13a to 13d, defining rows of cells 11. In this case, there are four rows of cells 11. If any one of the cells 11 connected to a match line 13a to 13d does not match the bit on its respective search line, the match line connected to that cell will indicate a no match. Only match lines for which all connected cells 11 match their respective search line bit will indicate a match.

In practice, this is accomplished by charging all match lines to an active or charged state at the beginning of each cycle. If a cell 11 does not match the bit on its search line, it will act to pull down its connected match line, thereby rendering it inactive, and indicating a no-match.

In the example of FIG. 1, at the beginning of a search cycle, all of the match lines 13a, 13b, 13c and 13d are charged to an active state. As the four-bit word 0110 is input to device 10, search lines 12a, 12a' are charged to indicate a '0', lines 12b, 12b' are charged to indicate a "1", lines 12c, 12c' are charged to indicate a "1" and lines 12d, 12d' are charged to indicate a "0".

Looking now at the first column (between search lines 12a, 12a'), the top cell 11, storing a "1" does not match the data on its corresponding search lines, and so pulls match line 13a down to an inactive state, indicating a no-match. Match line will remain in the inactive, "no-match" state, regardless of whether any of the other cells match in that row.

Looking now at the second row, cell 16 storing a "0" matches with the data on search lines 12a, 12a' and so does not pull down the active state of match line 13b. Looking at the other cells in that row, each cell stores data that matches the data on their corresponding search lines, and so no cells pull down match line 13b. Accordingly, match line 13b indicates a match.

Similarly, all cells in the third row (starting with cell 17) match their corresponding search lines and so match line 13c remains active to indicate a match.

In the fourth row, cell 18 stores a "1", while search lines 12a, 12a' store a "0". Therefore, the mismatch pulls match line 13 down to an inactive state, indicating a mismatch. As previously described, match line 13d will remain inactive regardless of the state of the other cells in that row.

The output of the cell array, being no-match, match, match, no-match is fed into an encoder 19 via amplifiers 15a to 15d. Encoder 19 converts the match information from the match lines into addresses which are then used to locate the searched for data. This arrangement provides a highly parallel lookup engine, however, such an arrangement can suffer from sensitivity to noise and process variations, especially in the case of wider CAMs.

Accordingly, it is an object of the present invention to provide an improved CAM arrangement.

SUMMARY OF THE INVENTION

According to one aspect of the present invention, there is provided a content addressable memory (CAM) array including a plurality of memory cells for storing data; respective search lines for loading search data into the array for comparison with the data in the memory cells; respective match lines for providing match data relating to the result of the comparison of the data and the search data; a plurality of respective sensing blocks for sensing the match data on the match lines; a dummy cell for storing dummy data; a dummy search line for loading dummy search data into the array for comparison with the dummy data; a dummy match line for providing dummy match data relating to the result of the comparison between the dummy data and the dummy search data; a dummy reference match line for providing dummy match data relating to the result of the comparison between the dummy data and the dummy search data; and a dummy sensing block for sensing the dummy match data on the dummy match line and the reference dummy match line; wherein in use, the dummy match data on the dummy reference match line arrives at the dummy sensing block before the dummy match data on the dummy match line, thereby providing a time window therebetween during which the dummy sensing block senses the dummy match data on the dummy match line.

In one aspect, the dummy cell is located at a distal end from the dummy sensing block. In a further aspect, the dummy sensing block and/or the sensing blocks use dynamic Vtn-based sensing. In a further aspect, upon the dummy sensing block receiving the reference dummy match line match data, a pre-charge on the dummy sensing block is released to allow sensing of the dummy match data on the dummy match line. In yet a further aspect, upon the dummy sensing block receiving the dummy match data, the dummy sensing block outputs a signal to enable evaluation of the sensing blocks for the respective match lines.

In a further aspect, upon the dummy sensing block receiving the dummy match data, the dummy sensing block outputs a signal to latch the data sensed by the respective sensing blocks. In another aspect, upon the dummy sensing block receiving the dummy match data, the dummy sensing block outputs a signal to a control block for resetting the CAM array for a subsequent search cycle. In yet a further aspect, the resetting of the CAM array comprises pre-charging the respective search lines and the respective match lines. In another aspect, the resetting of the CAM array further comprises resetting the respective match sensing blocks. Optionally, the CAM array is a Binary CAM (BCAM) array. Alternatively, the CAM array is a Ternary CAM (TCAM) array.

According to another aspect of the present invention, there is provided a method of operating a content addressable memory (CAM) array includes a plurality of memory cells for storing data; respective search lines for loading search data into the array for comparison with the data in the memory cells; respective match lines for providing match data relating to the result of the comparison of the data and the search data; a plurality of respective sensing blocks for sensing the match data on the match lines; a dummy cell for storing dummy data; a dummy search line for loading dummy search data into the array for comparison with the dummy data; a dummy match line for providing dummy match data relating to the result of the comparison between the dummy data and the dummy search data; a dummy reference match line for providing dummy match data relating to the result of the comparison between the dummy data and the dummy search data; a dummy sensing block for sensing the dummy match data on the dummy match line and the reference dummy match line; the method comprising causing the dummy match data on the dummy reference match line to arrive at the dummy sensing block before the dummy match data on the dummy match line, thereby providing a time window therebetween during which the dummy sensing block senses the dummy match data on the dummy match line.

In one aspect, the method further comprises locating the dummy cell at a distal end from the dummy sensing block. In another aspect, the method further comprises using dynamic Vtn-based sensing in the dummy sensing block and/or the sensing blocks. In a further aspect, the method further comprises, upon the dummy sensing block receiving the reference dummy match line match data, releasing a pre-charge on the dummy sensing block to allow sensing of the dummy match data on the dummy match line. The method may further comprise, upon the dummy sensing block receiving the dummy match data, enabling evaluation of the sensing blocks for all the respective match lines. Furthermore, the method may comprise, upon the dummy sensing block receiving the dummy match data, causing the dummy sensing block to output a signal to latch the data sensed by the respective sensing blocks.

BRIEF DESCRIPTION OF THE DRAWINGS

The invention will now be described in detail with reference to the following figures in which.

DETAILED DESCRIPTION

The present invention will now be described in detail with reference to one or more embodiments of the invention, examples of which are illustrated in the accompanying drawings. The examples and embodiments are provided by way of explanation only and are not to be taken as limiting to the scope of the invention. Furthermore, features illustrated or described as part of one embodiment may be used with one or more other embodiments to provide a further new combination.

It will be understood that the present invention will cover these variations and embodiments as well as variations and modifications that would be understood by the person skilled in the art.

Figure 1:
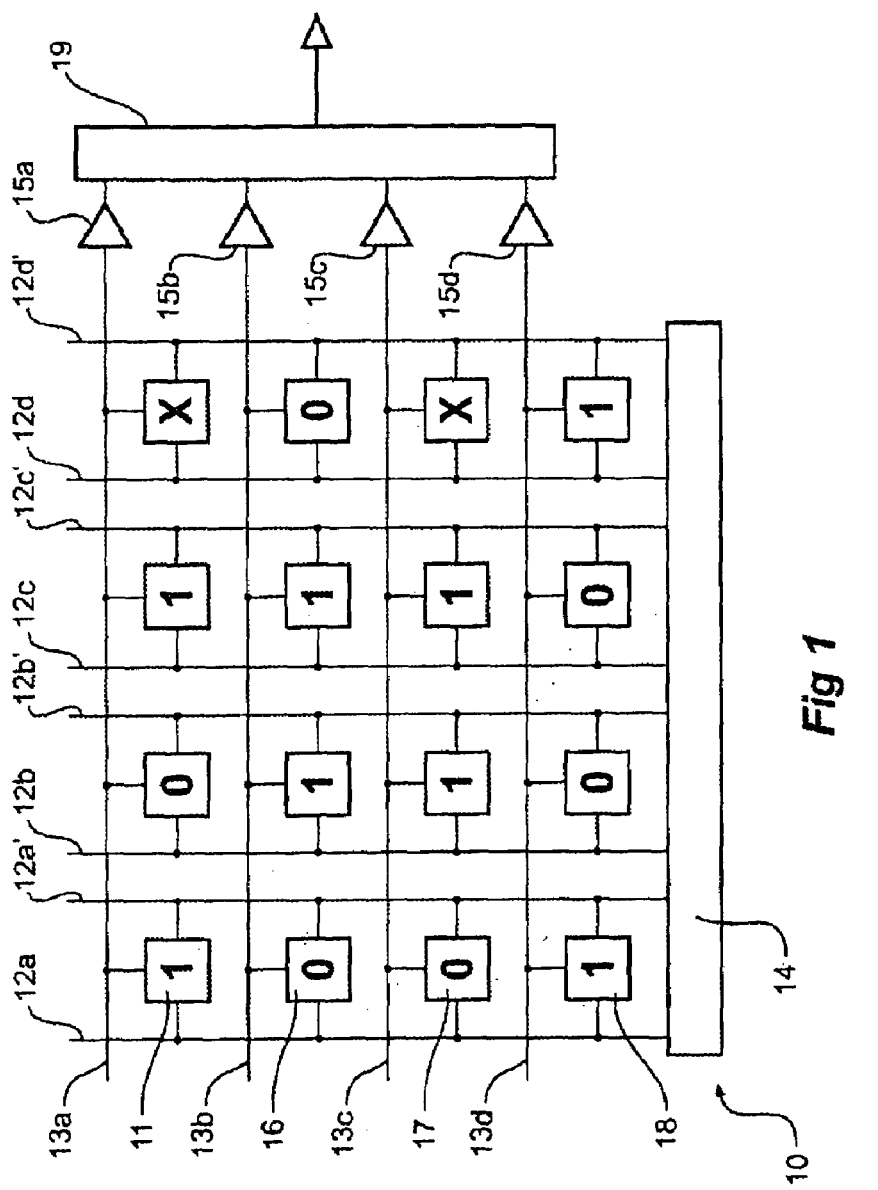
FIG. 1 shows a conventional TCAM device arrangement.
Figure 2:
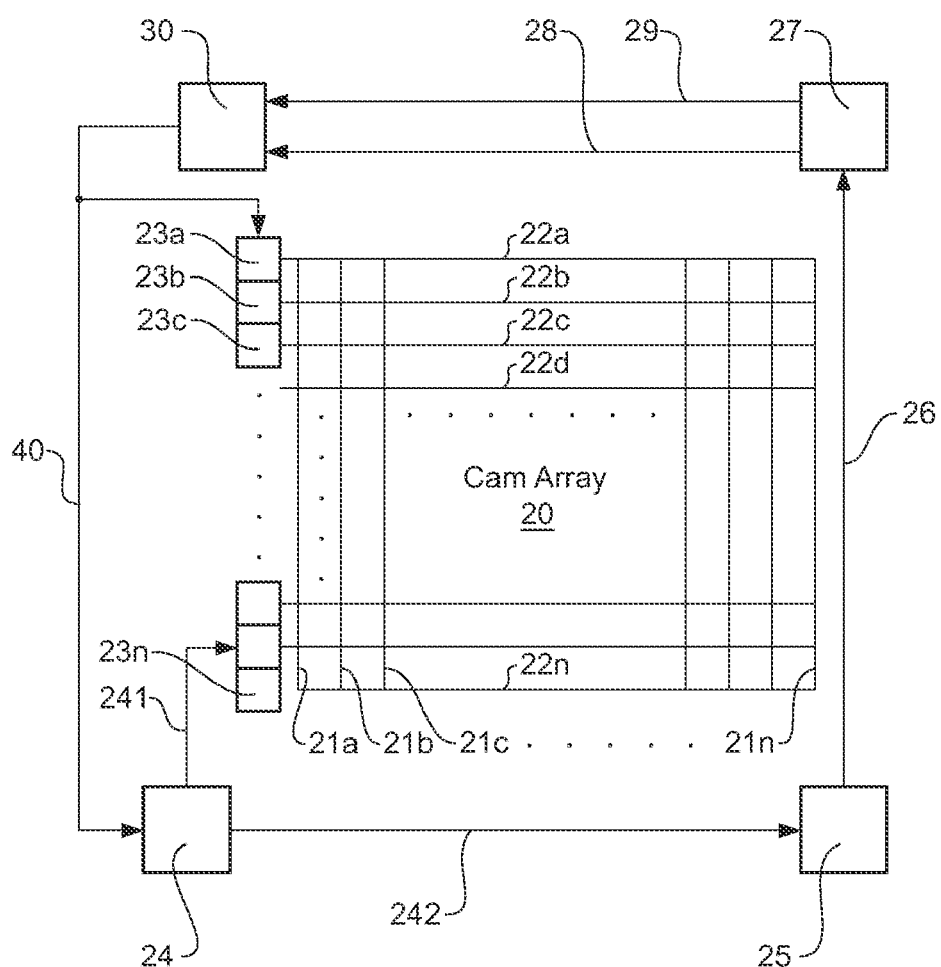
FIG. 2 shows an arrangement of a CAM device according to an aspect of the present invention.

Referring now to FIG. 2, there is shown a CAM array 20 (which could be either a Binary CAM (BCAM) or a Ternary CAM (TCAM)), including a plurality of CAM cells (not shown), connected to their respective search lines 21a, 21b, 21c to 21n and respective match lines 22a, 22b, 22c to 22n. As previously discussed, at the beginning of a search cycle, input data is applied to the search lines 21a to 21n of the array 20 via input drivers (not shown), and all match lines 22a to 22n are pre-charged high.

According to an aspect of the present invention, dummy search line 26 is also loaded with a dummy data bit (for example a 1) via dummy driver 25. This dummy data bit is then compared with the data stored in dummy CAM cell 27 (for example a 0). The data applied to dummy search line 26 is always designed to provide a mismatch with the data stored in dummy cell 27.

For wide CAM arrays, evaluation of the match lines can take a relatively significantly long time (about 1 to 2 nanoseconds) due to the large loads. The longest evaluation time occurs when there is a single mismatch in a row. When there are multiple mismatches, there are more evaluation paths and transitions are faster. It is therefore useful to have a sensing scheme that caters for the worst-case scenario.

According to this aspect of the invention, the dummy cell 27 is placed at the far end of the row (away from the sensing end) so as to provide the maximum time before its mismatch signal reaches the dummy sensing block 30.

Reference match line 29 is also provided to trigger the start of the evaluation cycle. Reference match line 29 is designed to provide the trigger signal to dummy sensing block 30 faster than dummy match line 28. This is done so that a time window is provided for sensing the dummy match line data in the dummy sensing block 30. Upon reference match line 29 providing its signal to dummy sensing block 30, the dummy sensing block pre-charge is released and evaluation is enabled to allow sensing of the dummy match data on the dummy match line 28. The signals from all other array match lines 22a to 22n would have reached their respective sensing blocks by the time that the dummy sensing block 30 evaluates. Upon the dummy sensing block 30 receiving the dummy match data, dummy sensing block outputs a signal to the respective row sensing blocks 23a, 23b, 23c to 23n to begin evaluating the results of the individual cell/data comparisons that have occurred in that row.

Reference match line 29 is designed to provide the trigger signal to dummy sensing block 30 faster than dummy match line 28. This is done so that a time window is provided during which all of the match lines are able to be sensed, before the sensing stage is caused to be completed by the signal from dummy match line 28.

Reference match line 29 is designed to be faster than dummy match line 28 by a faster transistor structure. This is done by using a larger transistor (almost three times the size of the transistor used for the dummy match line evaluation) for the reference dummy match line 29 evaluation.

By the time that the mismatch signal from the dummy match line 28 reach dummy sensing block 30, sensing blocks 23a to 23n are also stable for evaluation.

Dummy sensing block 30 outputs its signals to sensing blocks 23a to 23n via connection 40. This signal results in the removal of the pre-charge and enables the evaluation of sensing blocks 23a to 23n. Match latches (not shown), after the sensing stage, are also made transparent to capture the output of the respective sensing blocks.

Upon receiving dummy match line 28 signal, dummy sensing block 30 also outputs a signal on connection 40 to control block 24. Upon receiving this signal, control block 24 resets the array 20 for the next search cycle. This involves pre-charging the search bit lines and match lines, resetting the dynamic sensing blocks (via connection 241 see FIG. 2) and shutting off match latches so that the data is latched.

According to an aspect of the invention, sensitivity to disturbances such as IR, high peak currents and leakage effects is reduced by the use of Vtn sensing in the dummy sensing block 30 and/or the sensing blocks 23a to 23n (sensing stage). In this scheme, when the input signal reaches Vtn, the dynamic stages 23 will respond upon pre-charge release. A small pull down patch (not shown) is provided which is cut off after the dynamic stage output flips, as further protection against high leakage currents in certain corners and configurations.

The timing of the pre-charge release/evaluate of the dynamic stages for each row, is controlled by the dummy tracking (or reference) dynamic stage's output. The dummy tracking row's 28 pre-charge release/evaluate itself is triggered by the faster version of the dummy match signal. It will be appreciated that for very large configurations, the dummy match line 28 can be a very slow transition, which can lead to a large variation of the sense stage's response. This variation could be high for an inverter based sensing due to PMOS vs NMOS ratio, supply disturbances due to high peak currents in TCAM circuits (particularly large CAMs), coupling effects etc.

In the Vtn based scheme, the risk of susceptibility to disturbances like these is highly reduced due to the dependency of the sense stage up to Vtn, and no greater. Once evaluated, the data is "locked in".

Figure 3:
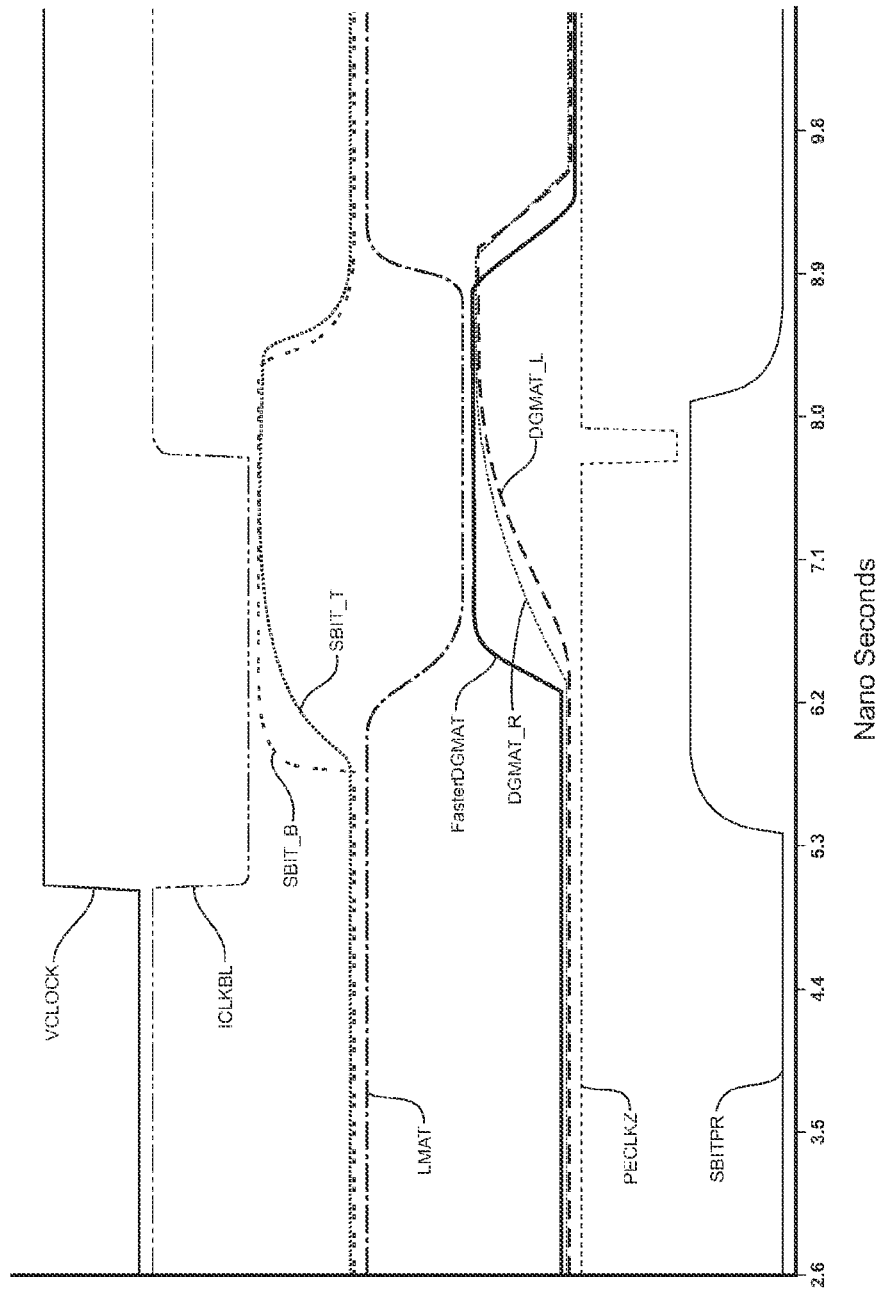
FIG. 3 is a timing diagram for various signals in the CAM device of FIG. 2

The following will now describe the operation of the various elements of array 20 with reference to FIG. 3, showing the timing of various signals. VCLOCK is a Primary clock input to the array 20 which provides a base timing for the remainder of the signals. ICLKBL is an internal self timed clock triggered by an internal clock generator (not shown) in control block 24. ICLKBL fires on the rising edge of VCLOCK.

ICLKBL is reset when the tracking signal that it triggers comes back to control block 24 (via connection 40) after triggering the evaluation of all the sense stages in the array 20 as previously described. The resetting of this clock starts the resetting (pre-charge/pre-discharge) of various bitlines/local match lines/global match lines, and dummy match lines. After a small delay from arrival of the dummy tracking signal for reset, the dynamic stage evaluate signal (which is also used as latch enable for the match latch) resets the dummy tracking signal, thus shutting off the latch.

The SBITPRE signals goes high (upon being triggered by leading edge of ICLKBL) which releases the pre-charge on the search bitlines, and returns to a low state upon being triggered by the reset path, which then pre-charges the bitlines again.

Signals SBIT_B and SBIT_T are signals on search bitlines at the bottom and top of the array. These are triggered after the internal clock generation ICLKBL. Signal LMAT is a local match signal evaluated by the far end (with respect to where the sense stage is located) cell and is triggered by Search bitline signals SBIT_B and SBIT_T. FasterDGMAT signal is the signal on reference line 29 and is an advanced version of the DGMAT signal of the dummy match line 28 signal DGMAT (see below) with a sharper transition time.

The DGMAT_L and DGMAT_R signals are the dummy match line 28 signals at the sense stage input [L] and far end [R] (see FIG. 2) and are triggered by the dummy search bitline 26. This is a similar waveform as SBIT_B and SBIT_T). This signal not only evaluates the dynamic stages, but also opens the latch (not shown) after the dynamic stage to capture the evaluated value. The latch is shut off after a delay, so that it is transparent during the latch window only. This permits reuse of the array for the next cycle.

The PECLKZ signal is a pulse that is triggered after the match latch window is closed, and is used to trigger the priority encoder block that processes the latched match results. The FasterDGMAT and DGMAT signals are reset through the regular tracking circuits (around the array 20), while the sensing blocks pre-charge signal is triggered by an earlier signal from the control block 24 after a small delay corresponding to the time required for latching for the result of the bottommost row.

The invention claimed is:

1. A content addressable memory (CAM) array comprising:
   a plurality of memory cells for storing data;
   respective search lines for loading search data into the array for comparison with the data in the memory cells;
   respective match lines for providing match data relating to the result of the comparison of the data and the search data;
   a plurality of respective sensing blocks for sensing the match data on the match lines;
   a dummy cell for storing dummy data;
   a dummy search line for loading dummy search data into the array for comparison with the dummy data;
   a dummy match line for providing dummy match data relating to the result of the comparison between the dummy data and the dummy search data;
   a dummy reference match line for providing dummy match data relating to the result of the comparison between the dummy data and the dummy search data; and
   a dummy sensing block for sensing the dummy match data on the dummy match line and the reference dummy match line;
   wherein in use, the dummy match data on the dummy reference match line arrives at the dummy sensing block before the dummy match data on the dummy match line, thereby providing a time window therebetween during which the dummy sensing block senses the dummy match data on the dummy match line.

2. A CAM array as claimed in claim 1 wherein the dummy cell is located at a distal end from the dummy sensing block.

3. A CAM array according to claim 1 wherein the CAM array is a Binary CAM (BCAM) array.

4. A CAM array according to claim 1 wherein the CAM array is a Ternary CAM (TCAM) array.

5. A CAM array as claimed in claim 2 wherein the dummy sensing block and/or the sensing blocks use dynamic Vtn-based sensing.

6. A CAM array as claimed in claim 5 wherein upon the dummy sensing block receiving the reference dummy match line match data, a pre-charge on the dummy sensing block is released to allow sensing of the dummy match data on the dummy match line.

7. A CAM array as claimed in claim 6 wherein upon the dummy sensing block receiving the dummy match data, the dummy sensing block outputs a signal to enable evaluation of the sensing blocks for the respective match lines.

8. A CAM array as claimed in claim 7 wherein upon the dummy sensing block receiving the dummy match data, the dummy sensing block outputs a signal to latch the data sensed by the respective sensing blocks.

9. A CAM array as claimed in claim 8 wherein upon the dummy sensing block receiving the dummy match data, the dummy sensing block outputs a signal to a control block for resetting the CAM array for a subsequent search cycle.

10. A CAM array as claimed in claim 9 wherein the resetting of the CAM array comprises pre-charging the respective search lines and the respective match lines.

11. A CAM array as claimed in claim 10 wherein the resetting of the CAM array further comprises resetting the respective match sensing blocks.

12. A method for operating a content addressable memory (CAM) array comprising:
   a plurality of memory cells for storing data;
   respective search lines for loading search data into the array for comparison with the data in the memory cells;
   respective match lines for providing match data relating to the result of the comparison of the data and the search data;
   a plurality of respective sensing blocks for sensing the match data on the match lines;
   a dummy cell for storing dummy data;
   a dummy search line for loading dummy search data into the array for comparison with the dummy data;
   a dummy match line for providing dummy match data relating to the result of the comparison between the dummy data and the dummy search data;
   a dummy reference match line for providing dummy match data relating to the result of the comparison between the dummy data and the dummy search data;
   a dummy sensing block for sensing the dummy match data on the dummy match line and the reference dummy match line;
   the method comprising causing the dummy match data on the dummy reference match line to arrive at the dummy sensing block before the dummy match data on the dummy match line, thereby providing a time window therebetween during which the dummy sensing block senses the dummy match data on the dummy match line.

13. A method of operating a CAM array as claimed in claim 12 further comprising locating the dummy cell at a distal end from the dummy sensing block.

14. A method of operating a CAM array as claimed in claim 13 comprising using dynamic Vtn-based sensing in the dummy sensing block and/or the sensing blocks.

15. A method of operating a CAM array as claimed in claim 14 further comprising upon the dummy sensing block receiving the reference dummy match line match data, releasing a pre-charge on the dummy sensing block to allow sensing of the dummy match data on the dummy match line.

16. A method of operating a CAM array as claimed in claim 15 further comprising upon the dummy sensing block receiving the dummy match data, enabling evaluation of the sensing blocks for all the respective match lines.

17. A method of operating a CAM array as claimed in claim 16 further comprising upon the dummy sensing block receiving the dummy match data, causing the dummy sensing block to output a signal to latch the data sensed by the respective sensing blocks.

* * * * *